United States Patent

Mizuta

[11] Patent Number: 5,828,892
[45] Date of Patent: Oct. 27, 1998

[54] MEMORY CARDS CAPABLE OF OPERATING WITH MORE THAN ONE POWER SUPPLY VOLTAGE

[75] Inventor: Masaharu Mizuta, Tokyo, Japan

[73] Assignee: Mitsubishi Denki Kabushiki Kaisha, Tokyo, Japan

[21] Appl. No.: 701,801

[22] Filed: Aug. 26, 1996

[30] Foreign Application Priority Data

Feb. 27, 1996 [JP] Japan .................................. 8-039825

[51] Int. Cl.$^6$ .............................. G06F 1/26; G11C 7/00
[52] U.S. Cl. ..................................... 395/750.01; 365/226
[58] Field of Search ...................... 395/750.01, 750.08, 395/182.2; 365/226, 227, 228; 326/80

[56] References Cited

U.S. PATENT DOCUMENTS

| | | | |
|---|---|---|---|
| 5,267,211 | 11/1993 | Kobayashi et al. | 265/228 |
| 5,267,218 | 11/1993 | Elbert | 365/226 |
| 5,329,491 | 7/1994 | Brown et al. | 365/226 |
| 5,444,298 | 8/1995 | Schutz | 257/691 |
| 5,450,365 | 9/1995 | Adachi | 365/226 |
| 5,615,328 | 3/1997 | Hadderman et al. | 395/182.2 |

FOREIGN PATENT DOCUMENTS 7-021791  1/1995  Japan .............................. G11C 16/06

*Primary Examiner*—Glenn A. Auve

[57] ABSTRACT

A memory card including a DRAM integrated circuit that operates at 3.3 V is designed to be used with an information processing device that provides the memory card with a power supply voltage of 3.3 V or 5 V. The memory card includes a power supply voltage control circuit for producing a voltage of 3.3 V from the power supply voltage provided by the information processing device and an input/output buffer disposed between the information processing device and the DRAM integrated circuit which receives the voltage of 3.3 V from the power supply voltage control circuit and converts the voltages of the signals from either device so that they can properly receive and process the signals therebetween.

4 Claims, 2 Drawing Sheets

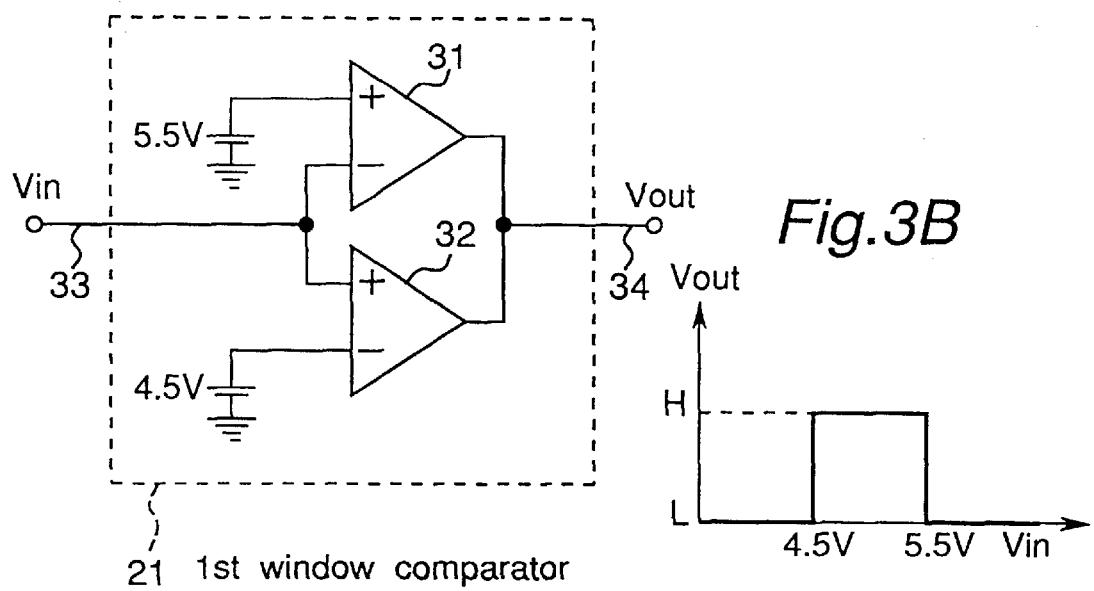
Fig.3A
Fig.3B
21 1st window comparator
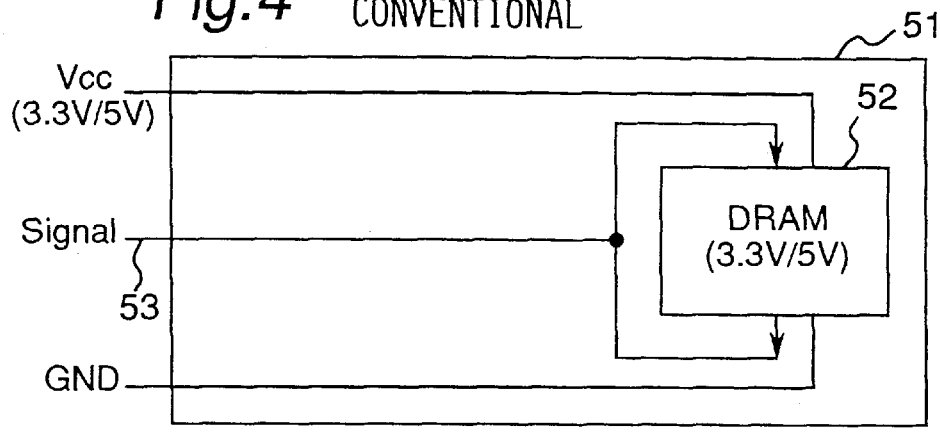
Fig.4 CONVENTIONAL
Fig.5
| A.C. voltage used | | 5V±10% | 3.3V±10% |
|---|---|---|---|
| Current consumption | Waiting | 5.5mW | 1.8mW |
| | Operating | 550mW | 288mW |

MEMORY CARDS CAPABLE OF OPERATING WITH MORE THAN ONE POWER SUPPLY VOLTAGE

FIELD OF THE INVENTION

The present invention relates to a PC card, implemented with DRAM memory in conformity with the PCMCIA standard, more particularly to a memory card which is of low power consumption and works independently of the power supply voltage.

DESCRIPTION OF THE PRIOR ART

FIG. 4 shows a conventional DRAM memory card. As shown in the figure, a conventional DRAM card 51 (simply referred to as the memory card hereinafter) is connected to the power lines Vcc through which the power supply voltage for DRAM integrated circuits 52 is provided by an information processing device (referred to as the PC hereinafter). The DRAM card is also coupled to data access control lines 53 for exchanging data with the information processing device and to the ground GND. Although a typical memory card includes a plurality of DRAM integrated circuits 52, only a single DRAM integrated circuit is shown in the figure for simplificity. Through data access control lines 53 address signals, data, and read/write control signals in conformity with the PCMCIA standard are exchanged between the PC and the memory card.

In the past the power supply voltage and the signal voltage for most DRAM integrated circuits 52 were 5 V. In recent years, however, voltages for some DRAM integrated circuits 52 were lowered to 3.3 V in order to avoid the dielectric breakdown caused by the finer patterns required to create more integrated LSIs. Therefore, at this point in time two kinds of DRAM integrated circuits coexist in the market: one has the operating voltage of 5 V (referred to as the 5 V DRAMs); and the other, 3.3 V (referred to as the 3.3 V DRAMs). The PC supplies an appropriate voltage to a memory card connected thereto by detecting its operating voltage. That is, if the memory card operates at 5V, the PC supplies 5 V to it; and if the memory card operates at 3.3 V, the PC supplies 3.3 V to it. Some PCs, however, can supply only 5V and hence cannot be used with memory cards which operate at 3.3 V.

SUMMARY OF THE INVENTION

FIG. 5 shows the power consumption of the 5 V and 3.3 V DRAM integrated circuits used in memory cards. It indicates that the current consumption for the 3.3 V DRAM in the operation mode is about a half that of the 5 V DRAM.

Hence, replacing 5 V DRAMs in a memory card with 3.3 V DRAMs dramatically reduces the current consumption and, accordingly, extends the lifetime of the battery within the PC. One drawback of the 3.3 V DRAM memory card, however, is that it cannot be used for a PC which provides only a 5 V power supply voltage.

The purpose of the present invention, therefore, is to provide a DRAM memory card, of low power consumption, that operates regardless of the voltage supplied by the information processing device connected thereto.

The first memory card according to the present invention includes an integrated circuit memory operating at a predetermined working voltage, which is used by being inserted in an information processing device, and is powered by the information processing device. The first memory card further includes a power supply voltage control circuit which converts the power supply voltage provided by the information processing device to the working voltage of the integrated circuit memory when the power supply voltage is higher than the working voltage on one hand, and outputs the power supply voltage intact when the power supply voltage is equal to the working voltage on the other; and an input/output buffer which receives the drive voltage from the power supply voltage control circuit, and is disposed between the information processing device and the integrated circuit memory, and converts the voltages of the signals from the information processing device and the integrated circuit memory.

The power supply voltage control circuit converts the power supply voltage provided by the information processing device to the working voltage of the integrated circuit memory when the power supply voltage provided by the information processing device is higher than the working voltage of the integrated circuit memory while it outputs the power supply voltage intact when the power supply voltage is equal to the working voltage of the integrated circuit memory. The input/output buffer converts the voltage of the signals from the information processing device to the working voltage of the integrated circuit memory and also the voltage of the signals from the integrated circuit memory to the voltage that the information processing device can handle. Thus, the power supply voltage control circuit and the input/output buffer convert the power supply voltage and the voltage of the signals provided by the information processing device respectively and allow the integrated circuit memory to operate regardless of the power supply voltage provided by the information processing device.

Preferably, the input/output buffer of the first memory card receives and produces signals which have voltages within a predetermined range (tolerance free).

The input/output buffer converts the signal voltage within a predetermined range provided by the information processing device to a first voltage and outputs it to the integrated circuit memory. Similarly the input/output buffer converts the signal voltage from the integrated circuit memory to a voltage within the predetermined range which the information processing device can handle and outputs it to the information processing device. Thus, the input/output buffer allows for data exchange between the information processing device and the integrated circuit memory.

The power supply voltage control circuit of the first memory card includes a voltage detecting circuit which compares the power supply voltage provided by the information processing device with the working voltage of the integrated circuit memory and determines whether or not the two voltages are equal; and a voltage output circuit which, on one hand converts the power supply voltage to the working voltage and outputs it when the voltage detecting circuit determines that the power supply voltage is higher than the working voltage, and on the other hand outputs the power supply voltage intact when the power supply voltage is equal to the working voltage.

The voltage detecting circuit of the power supply voltage control circuit compares the power supply voltage provided by the information processing device with the working voltage of the integrated circuit memory and determines whether or not the two voltages are equal. The voltage output circuit converts the power supply voltage to the working voltage and outputs it when the voltage detecting circuit determines that the power supply voltage is higher than the working voltage, and it outputs the power supply voltage intact when the power supply voltage is equal to the working voltage. This allows the power supply voltage control circuit to output a voltage which is equal to the working voltage of the integrated circuit memory regardless of the power supply voltage provided by the information processing device.

Preferably, the power supply voltage control circuit of the first memory card includes an input terminal for receiving the power supply voltage from the information processing device; an output terminal for providing the integrated circuit memory with the working voltage thereof; a first voltage detection circuit which has an input connected to the input terminal, determines whether or not the power supply voltage is equal to a predetermined voltage higher than the working voltage, and produces a control signal; a first switch which has one of the terminals thereof connected to the input terminal, receives the control signal from the output of the first voltage detection circuit, switches on or off according to the control signal from the first voltage detection circuit, and comes on in order to output the power supply voltage when it is equal to the predetermined voltage; a DC-DC converter which has an input connected to the other terminal of the first switch, couples the output thereof with the output terminal, and converts the input voltage received through the first switch to the working voltage; a second voltage detection circuit which has an input connected to the input terminal, determines whether or not the power supply voltage is equal to the working voltage, and produces a control signal; and a second switch which has one of the terminals thereof connected to the input terminal and the other to the output terminal, receives the control signal from the output of the second voltage detection circuit, switches on or off according to the control signal from the second voltage detection circuit, and comes on in order to output the power supply voltage when it is equal to the working voltage.

The first voltage detection circuit determines whether or not the power supply voltage is equal to a predetermined voltage higher than the working voltage and produces a control signal. The first switch comes on and outputs the power supply voltage to the DC-DC converter, according to the control signal from the first voltage detection circuit, when it determines that the power supply voltage is equal to the predetermined voltage. The DC-DC converter converts the power supply voltage to the working voltage and outputs it. The second voltage detection circuit determines whether or not the power supply voltage is equal to the working voltage and produces a control signal. The second switch comes on and outputs the power supply voltage intact, according to the control signal from the second voltage detection circuit, when it determines that the power supply voltage is equal to the working voltage.

The second memory card according to the present invention includes an integrated circuit memory operating at a predetermined working voltage, which is used by being inserted in an information processing device, and is powered by the information processing device. The second memory card further includes a power supply voltage control circuit which, on one hand converts the power supply voltage provided by the information processing device to the working voltage of the integrated circuit memory when the power supply voltage is different from the working voltage, and on the other hand outputs the power supply voltage intact when the power supply voltage is equal to the working voltage; and an input/output buffer which receives the drive voltage from the power supply voltage control circuit, is disposed between the information processing device and the integrated circuit memory, and converts the voltages of the signals from the information processing device and the integrated circuit memory.

The power supply voltage control circuit of the second memory card supplies the integrated circuit memory with a voltage equal to the working voltage thereof regardless of the power supply voltage provided by the information processing device. The input/output buffer, disposed between the information processing device and the integrated circuit memory, converts the voltage of the signals from either device so that both can properly process the signals they receive. This allows the second memory card to operate even if the power supply voltage provided by the information processing device is different from the working voltage of the integrated circuit memory.

BRIEF DESCRIPTION OF THE DRAWINGS

These and other objects, features and advantages of the present invention will become clear from the following description taken in conjunction with the preferred embodiments with reference to the accompanying drawings, and in which:

FIG. 3A shows a circuit diagram of the first window comparator and FIG. 3B shows the relationship of the input and output of the first window comparator;

FIG. 4 shows a block diagram of a conventional memory card;

FIG. 5 is a table showing the power consumption of the DRAM memory;

DETAILED DESCRIPTION OF THE PREFERRED EMBODIMENT

The embodiments of the present invention are described in detail with reference to the accompanying drawings.

Figure 1:
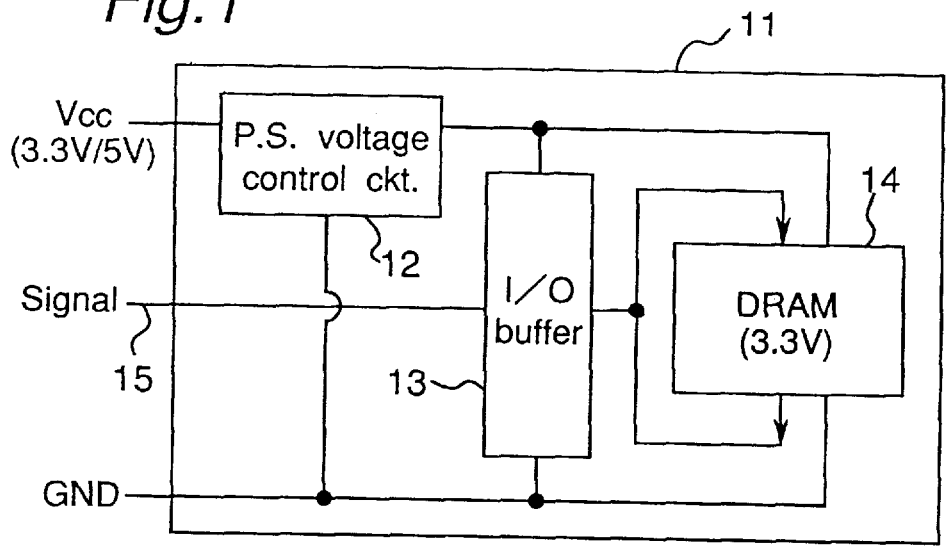
FIG. 1 shows a block diagram of the memory card of one embodiment of the present invention.

FIG. 1 shows the memory card of one embodiment of the present invention. The memory card 11 of the present embodiment includes a power supply voltage control circuit 12, the input of which is connected to the power supply line Vcc, an input/output buffer 13 which is connected to the output of power supply voltage control circuit 12 and also to data access control lines 15 for converting the voltages of the data and the various control signals exchanged with a PC, and a 3.3 V DRAM 14 which is connected to input/output buffer 13, through which the data and the control signals are exchanged with the PC, and is also connected to the output end of power supply voltage control circuit 12. Power supply voltage control circuit 12, input/output buffer 13, and DRAM integrated circuit 14 are all connected to the ground GND.

The PC supplies either DC 3.3 V or DC 5 V on the power supply line Vcc. Power supply voltage control circuit 12 (detailed description is given below) converts the input voltage supplied through Vcc to a predetermined voltage (3.3 V) and provides it to input/output buffer 13 and DRAM integrated circuit 14. Input/output buffer 13 is placed between the PC and DRAM integrated circuit 14 and converts the voltages of signals exchanged between them. The voltage of the input signals from the PC is either 3.3 V or 5 V and the voltage of the signals processed at DRAM integrated circuit 14 must be 3.3 V. Input/output buffer 13 converts the voltage of the signals when they go through the buffer from the PC to DRAM integrated circuits 14 or vise versa so that the signals can be processed properly in the target device. Input/output buffer 13 is "tolerance free" or if an input voltage to the buffer is between 3 V and 5.5 V, it can convert the voltage to 3.3 V. Therefore, input/output buffer 13 converts the signals (either 3.3 V or 5 V) from the PC to DRAM integrated circuit 14 to those signals DRAM integrated circuit 14 can process (3.3 V). Conversely, the input/output buffer 13 converts the signals from DRAM integrated circuit 14 to the PC to those signals the PC can process (either 3.3 V or 5 V). Input/output buffers with the aforementioned functions are commercially available in the form of ICs such as 74LV245 manufactured by National Semiconductor and Texas Instruments.

Figure 2:
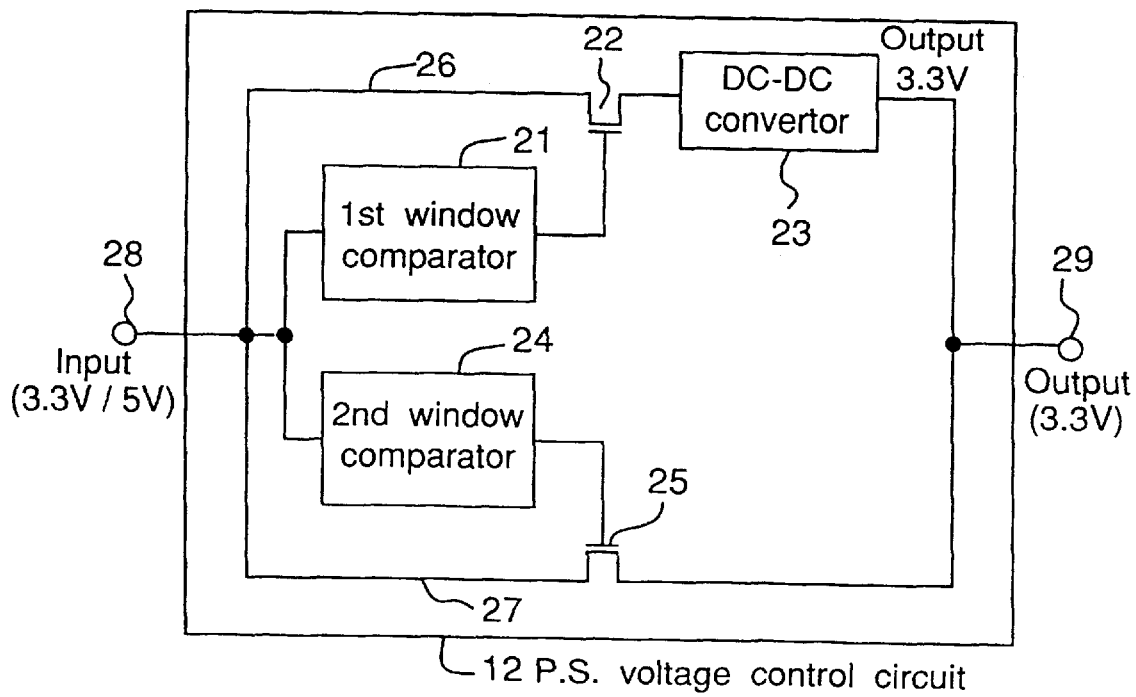
FIG. 2 shows a block diagram of the power supply voltage control circuit in one embodiment of the present invention.

Power supply voltage control circuit 12 is described in detail below with reference to FIG. 2. Power supply voltage control circuit 12 includes a first window comparator 21, the input of which is connected to an input terminal 28, a first switch 22, which has an input connected to input terminal 28 and is controlled by the control signal produced by first window comparator 21, a DC-DC converter 23 which has an input connected to the other terminal of first switch 22 and an output connected to an output terminal 29, a second window comparator 24, the input of which is connected to input terminal 28, and a second switch 25 which has an input connected to input terminal 28 and an output connected to output terminal 29 and is controlled by the control signal produced by second window comparator 24. First and second window comparators 21 and 24 produce a "High" level signal (referred to as "H") as a control signal if, and only if, they receive a signal with a voltage within a predetermined range. In the present embodiment first window comparator 21 produces an "H" signal when it receives 5 V±10% (4.5–5.5 V), and second window comparator 24 produces an "H" signal when it receives 3.3 V±10% (3.0–3.6 V). FIG. 3A shows a circuit of first window comparator 21. As shown in FIG. 3A, first window comparator 21 includes a first comparator 31 having a positive terminal connected to a 5.5 V standard and a negative terminal connected to the input 33 of first window comparator 21, and a second comparator 32 having a negative terminal connected to a 4.5 V standard and a positive terminal connected to the negative terminal of first comparator 31. The output from the two comparators is combined to form an output of first window comparator 21. Thus first window comparator 21 produces the "H" output voltage only when the input voltage Vin is within the range of 5 V±10% (4.5–5.5 V) as shown in FIG. 3B. Similarly, second window comparator 24 is formed by connecting a 3.6 V standard to the positive terminal of first comparator 31 and a 3.0 V standard to the negative terminal of second comparator 32. The second window comparator produces the "H" output voltage only when the input voltage Vin is within the range of 3.3 V±10% (3.0–3.6 V). Should the voltage from the PC vary, window comparators 21 and 24 each have a 10% safety margin for the input voltage. First and second switches 22 and 25 each include a device such as a low loss field effect transistor, are turned on when the control signal is "H", and turned off when the control signal is "L". DC-DC converter 23 produces a 3.3 V output for an input of 4.5 –5.5V.

Next, the operation of power supply voltage control circuit 12 is described. In reference to FIG. 2 a voltage of either 3.3 V or 5 V (it can vary within 10%) is provided by the PC on input terminal 28. If a voltage of 5 V is provided on input terminal 28, second window comparator 24 produces an "L" output and turns off second switch 25. Accordingly a path 27 is shut off. On the other hand first window comparator 21 produces a "H" output and turns on first switch 22. Therefore, the input voltage is applied to DC-DC converter 23 through a path 26. DC-DC converter 23 converts the input voltage from the PC to 3.3 V and outputs it. DC-DC converter 23 must be highly efficient so that its conversion loss is much less than the power consumption of a 5 V DRAM integrated circuit. In a case in which a voltage of 3.3 V is provided on input terminal 28, first window comparator 21 produces an "L" output and turns off first switch 22. Accordingly a path 26 is shut off. Second window comparator 24, however, produces an "H" output and turns on second switch 25. Thus, the input voltage is transferred directly to the output terminal. That is, for an input voltage of 5 V, power supply voltage control circuit 12 of the present embodiment produces an output voltage of 3.3 V using the DC-DC converter 23 of high efficiency, and, for an input voltage of 3.3 V, it outputs the voltage intact. Accordingly power supply voltage control circuit 12 can efficiently provide a predetermined voltage (3.3 V in this case) regardless of the input voltage.

When the power supply voltage from the PC to memory card 11 of the present embodiment is 5 V, power supply voltage control circuit 12 converts the voltage to 3.3 V and outputs it to input/output buffer 13 and 3.3 V DRAM integrated circuit 14. When the power supply voltage from the PC is 3.3 V, power supply voltage control circuit 12 does not change the power supply voltage, and the input voltage is transferred intact to input/output buffer 13 and 3.3 V DRAM integrated circuit 14. Input/output buffer 13 also changes the voltages of signals from the PC to DRAM integrated circuit 14 and vice versa, so that the PC and DRAM integrated circuit 14 can properly process the signals even if they operate at different signal voltages. Thus, since the memory card of the present embodiment changes the power supply voltage and the signal voltage as needed, it operates regardless of the power supply voltage and the signal voltage the PC provides.

The memory card of the present embodiment operates whether the power supply voltage provided by the PC is 5 V or 3.3 V. Further, the memory card uses DRAM integrated circuit 14 that operates at a low voltage, resulting in reduction of power consumption and extension of the lifetime of the battery in the PC.

It should be noted that replacing the aforementioned standard voltages for the first and second window comparators with other voltages and using a different voltage setting for the DC-DC converter or adding another DC-DC converter will create a memory card that will operate at a different working voltage and with a different power supply voltage provided by the information processing device.

Although the foregoing memory card of the present embodiment is implemented with DRAM memory, a memory card with flash memory instead of DRAM memory can also produce a similar effect.

According to the first memory card of the present invention, even if the voltage supplied by an information processing device is higher than the working voltage of the integrated circuit memory of the memory card, the power supply voltage control circuit and the input/output buffer convert the voltage to an appropriate voltage so that the integrated circuit memory can operate properly. This allows integrated circuit memory that operates at a low voltage to be used in the memory card regardless of the voltage the PC provides and results in a memory card that consumes a low current. The memory card of the present invention operates independently of the voltage the information processing device provides to it.

The foregoing input/output buffer of the first memory card of the present invention in the preferred embodiment can input and output signals within a certain voltage range. Therefore, the input/output buffer can mediate the exchange of signals between the integrated circuit memory and the information processing device that provides the integrated circuit memory with a voltage different from the working voltage thereof.

When the information processing device provides the memory card with a voltage higher than the working voltage of the integrated circuit memory, the power supply voltage control circuit of the first memory card of the present invention, with a preferred configuration, lowers the voltage to the working voltage. When the information processing device provides the memory card with the same voltage as the working voltage of the integrated circuit memory, the power supply voltage control circuit does not change the voltage and outputs the input voltage intact. Therefore, the power supply voltage control circuit efficiently converts the input voltage from the information processing device.

When the information processing device provides the memory card with a power supply voltage higher than the working voltage of the integrated circuit memory, the power supply voltage control circuit of the first memory card of the present invention, with a preferred configuration, lowers the voltage to the working voltage. When the information processing device provides the memory card with the same voltage as the working voltage of the integrated circuit memory, the power supply voltage control circuit simply outputs the input voltage intact. This allows for an efficient voltage conversion.

According to the second memory card of the present invention, even if the voltage supplied by an information processing device is different from the working voltage of the integrated circuit memory of the memory card, the power supply voltage control circuit converts the power supply voltage and the input/output buffer converts the signal voltage to the appropriate voltages so that the integrated circuit memory can operate properly. This allows the memory card to operate regardless of the voltage the information processing device provides.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A memory card with at least one integrated circuit memory operating at a predetermined working voltage which is inserted in an information processing device, and is powered by the information processing device, said memory card comprising:
    a power supply voltage control circuit which includes
        a voltage detecting circuit which compares a power supply voltage provided by the information processing device with the working voltage of the integrated circuit memory and determines whether the voltages are equal or not, and
        a voltage output circuit which converts the power supply voltage to the working voltage and outputs the converted voltage when said voltage detecting circuit determines that the power supply voltage is higher than the working voltage, and outputs the power supply voltage intact when the power supply voltage is equal to the working voltage; and
    an input/output buffer, disposed between the information processing device and the integrated circuit memory, which receives a drive voltage from said power supply voltage control circuit and converts voltages of signals from the information processing device and the integrated circuit memory.

2. The memory card of claim 1, wherein said input/output buffer receives and produces signals which have voltages within a predetermined range.

3. The memory card of claim 1, wherein said power supply voltage control circuit includes
    an input terminal for receiving the power supply voltage from the information processing device;
    an output terminal for providing the integrated circuit memory with the working voltage;
    a first voltage detection circuit having an input connected to said input terminal, determines whether or not the power supply voltage is equal to a predetermined voltage higher than the working voltage, and produces a control signal;
    a first switch having one terminal thereof connected to said input terminal, receives the control signal from the output of said first voltage detection circuit, switches on or off according to the control signal from said first voltage detection circuit, and comes on in order to output the power supply voltage when the power supply voltage is equal to the predetermined voltage;
    a DC-DC converter which has an input connected to another terminal of said first switch, couples the output thereof with said output terminal, and converts the input voltage received through said first switch to the working voltage;
    a second voltage detection circuit having an input connected to said input terminal, determines whether or not the power supply voltage is equal to the working voltage, and produces a control signal; and
    a second switch having one terminal thereof connected to said input terminal and another terminal to said output terminal, receives the control signal from the output of said second voltage detection circuit, switches on or off according to the control signal from said second voltage detection circuit, and comes on in order to output the power supply voltage when the power supply voltage is equal to the working voltage.

4. A memory card with at least one integrated circuit memory operating at a predetermined working voltage which is inserted in an information processing device, and is powered by the information processing device, said memory card comprising:
    a power supply voltage control circuit which includes
        a voltage detecting circuit which compares a power supply voltage provided by the information processing device with the working voltage of the integrated circuit memory and determines whether the voltages are equal or not, and
        a voltage output circuit which converts the power supply voltage to the working voltage and outputs the converted voltage when said voltage detecting circuit determines that the power supply voltage is different from the working voltage, and outputs the power supply voltage intact when the power supply voltage is equal to the working voltage; and
    an input/output buffer, disposed between said information processing device and the integrated circuit memory, which receives a drive voltage thereof from said power supply voltage control circuit and converts voltages of signals from the information processing device and the integrated circuit memory.

* * * * *